(12) United States Patent
Mun et al.

(10) Patent No.: US 11,569,175 B2
(45) Date of Patent: Jan. 31, 2023

(54) SEMICONDUCTOR PACKAGE

(71) Applicant: Samsung Electronics Co., Ltd., Suwon-si (KR)

(72) Inventors: Kyungdon Mun, Hwaseong-si (KR); Myungsam Kang, Hwaseong-si (KR); Youngchan Ko, Seoul (KR); Yieok Kwon, Hwaseong-si (KR); Jeongseok Kim, Cheonan-si (KR); Gongje Lee, Seoul (KR); Bongju Cho, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/239,141

(22) Filed: Apr. 23, 2021

(65) Prior Publication Data

US 2022/0068822 A1  Mar. 3, 2022

(30) Foreign Application Priority Data

Aug. 25, 2020  (KR) .......................... 10-2020-0107176

(51) Int. Cl.
| | |
|---|---|
| *H01L 23/538* | (2006.01) |
| *H01L 25/065* | (2006.01) |
| *H01L 23/498* | (2006.01) |
| *H01L 23/00* | (2006.01) |
| *H01L 23/31* | (2006.01) |

(52) U.S. Cl.
CPC ...... *H01L 23/5386* (2013.01); *H01L 23/3128* (2013.01); *H01L 23/49816* (2013.01); *H01L 23/49822* (2013.01); *H01L 23/49833* (2013.01); *H01L 23/49838* (2013.01); *H01L 23/5385* (2013.01); *H01L 24/08* (2013.01); *H01L 24/73* (2013.01); *H01L 25/0657* (2013.01); *H01L 2224/08235* (2013.01);
(Continued)

(58) Field of Classification Search
CPC ............ H01L 23/5386; H01L 23/3128; H01L 23/49816; H01L 23/49822; H01L 23/49833; H01L 23/49838; H01L 23/5385; H01L 24/08; H01L 24/73; H01L 25/0657; H01L 2224/08235; H01L 2224/73204; H01L 2225/06517; H01L 2225/0652
See application file for complete search history.

(56) References Cited

U.S. PATENT DOCUMENTS

| | | |
|---|---|---|
| 8,810,024 B2 | 8/2014 | Lin et al. |
| 9,508,664 B1 | 11/2016 | Lin et al. |

(Continued)

*Primary Examiner* — Fernando L Toledo
*Assistant Examiner* — Neil R Prasad
(74) *Attorney, Agent, or Firm* — Myers Bigel, P.A.

(57) ABSTRACT

A semiconductor package includes a redistribution substrate including a first redistribution layer; a semiconductor chip electrically connected to the first redistribution layer; a vertical connection structure adjacent a periphery of the semiconductor chip and electrically connected to the first redistribution layer; and an encapsulant on the vertical connection structure. The vertical connection structure includes a metal pillar having a bottom surface facing the redistribution substrate, a top surface positioned opposite to the bottom surface, and a side surface positioned between the bottom surface and the top surface. The vertical connection structure further includes a plating layer on each of the bottom surface, the top surface, and the side surface of the metal pillar, and having a roughened surface.

20 Claims, 17 Drawing Sheets

(52) U.S. Cl.
CPC ............ *H01L 2224/73204* (2013.01); *H01L 2225/0652* (2013.01); *H01L 2225/06517* (2013.01)

(56) References Cited

U.S. PATENT DOCUMENTS

| | | |
|---|---|---|
| 10,020,263 B2 | 7/2018 | Lee et al. |
| 10,636,730 B2 | 4/2020 | Ho et al. |
| 2013/0113091 A1 | 5/2013 | Meng et al. |
| 2013/0249115 A1* | 9/2013 | Lin .................. H01L 21/56 257/E23.141 |
| 2013/0320530 A1 | 12/2013 | Koey et al. |
| 2014/0175663 A1* | 6/2014 | Chen ............... H01L 23/49816 257/774 |
| 2015/0008020 A1* | 1/2015 | Kaneko .............. H05K 3/465 174/250 |
| 2016/0379915 A1 | 12/2016 | Lee et al. |
| 2017/0053878 A1 | 2/2017 | Kajihara et al. |
| 2017/0179054 A1 | 6/2017 | Lin et al. |
| 2017/0352626 A1 | 12/2017 | Lin et al. |
| 2021/0225737 A1* | 7/2021 | Fang ................. H01L 25/0652 |

* cited by examiner

SEMICONDUCTOR PACKAGE

CROSS-REFERENCE TO RELATED APPLICATION(S)

This application claims benefit of priority to Korean Patent Application No. 10-2020-0107176 filed on Aug. 25, 2020 in the Korean Intellectual Property Office, the disclosure of which is incorporated herein by reference in its entirety.

FIELD

The present disclosure relates to a semiconductor package.

BACKGROUND

With miniaturization and improvements in performance of a semiconductor chip, interest is growing in a semiconductor package having improved rigidity and heat dissipation characteristics and a package-on-package (POP) structure in which a plurality of packages are coupled. For example, a semiconductor package that has improved rigidity and heat dissipation characteristics while implementing the POP structure by introducing a conductive structure into the package may be desired.

SUMMARY

An aspect of the present disclosure may provide a semiconductor package in which adhesion between a metal pillar and a surrounding insulating material is improved.

According to an aspect of the present disclosure, a semiconductor package may include: a redistribution substrate including a first redistribution layer; a semiconductor chip on the redistribution substrate and electrically connected to the first redistribution layer; a vertical connection structure adjacent a periphery of the semiconductor chip on the redistribution substrate and electrically connected to the first redistribution layer; an encapsulant on the redistribution substrate, the semiconductor chip, and the vertical connection structure; a redistribution structure on the encapsulant and including a second redistribution layer electrically connected to the vertical connection structure; and a connection bump on the redistribution substrate opposite to the semiconductor chip and electrically connected to the first redistribution layer, where the vertical connection structure includes: a metal pillar having a bottom surface facing the redistribution substrate, a top surface opposite to the bottom surface, and a side surface between the bottom surface and the top surface; and a plating layer on each of the bottom surface, the top surface, and the side surface of the metal pillar, and having a roughened surface.

According to another aspect of the present disclosure, a semiconductor package may include: a redistribution substrate including a first redistribution layer; a core structure on the redistribution substrate and having a first through-hole and at least one second through-hole adjacent a periphery of the first through-hole; a semiconductor chip in the first through-hole of the core structure and electrically connected to the first redistribution layer; at least one vertical connection structure in the at least one second through-hole of the core structure and electrically connected to the first redistribution layer; an encapsulant on the redistribution substrate, the semiconductor chip, the core structure, and the at least one vertical connection structure; and a redistribution structure on the encapsulant and including a second redistribution layer electrically connected to the at least one vertical connection structure, where the at least one vertical connection structure includes a metal pillar extending in a vertical direction and a first plating layer on a surface of the metal pillar, the core structure includes a metal frame adjacent a periphery of the semiconductor chip and the at least one vertical connection structure, and a second plating layer on a surface of the metal frame, and each of the first and second plating layers has a respective roughened surface.

According to another aspect of the present disclosure, a semiconductor package may include: a redistribution substrate including a redistribution layer; a semiconductor chip on the redistribution substrate and electrically connected to the redistribution layer; a vertical connection structure on the redistribution substrate, electrically connected to the redistribution layer, and having a surface roughness (Ra) of 0.5 μm or more; and an encapsulant on the redistribution substrate, the semiconductor chip, and the vertical connection structure.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, example embodiments of the present disclosure will now be described in detail with reference to the accompanying drawings.

Figure 1:
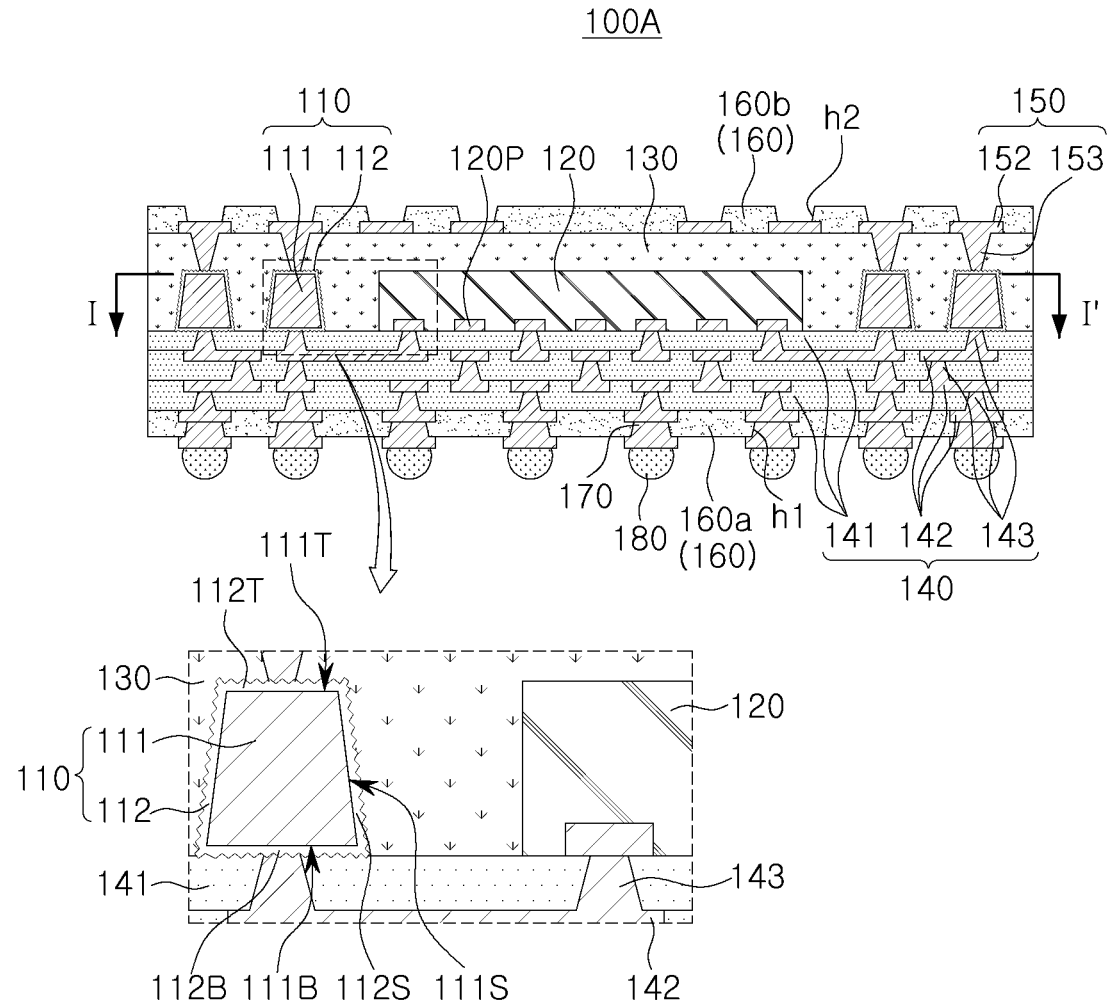
FIG. 1 is a cross-sectional view illustrating a semiconductor package according to an example embodiment of the present disclosure.
Figure 2A:
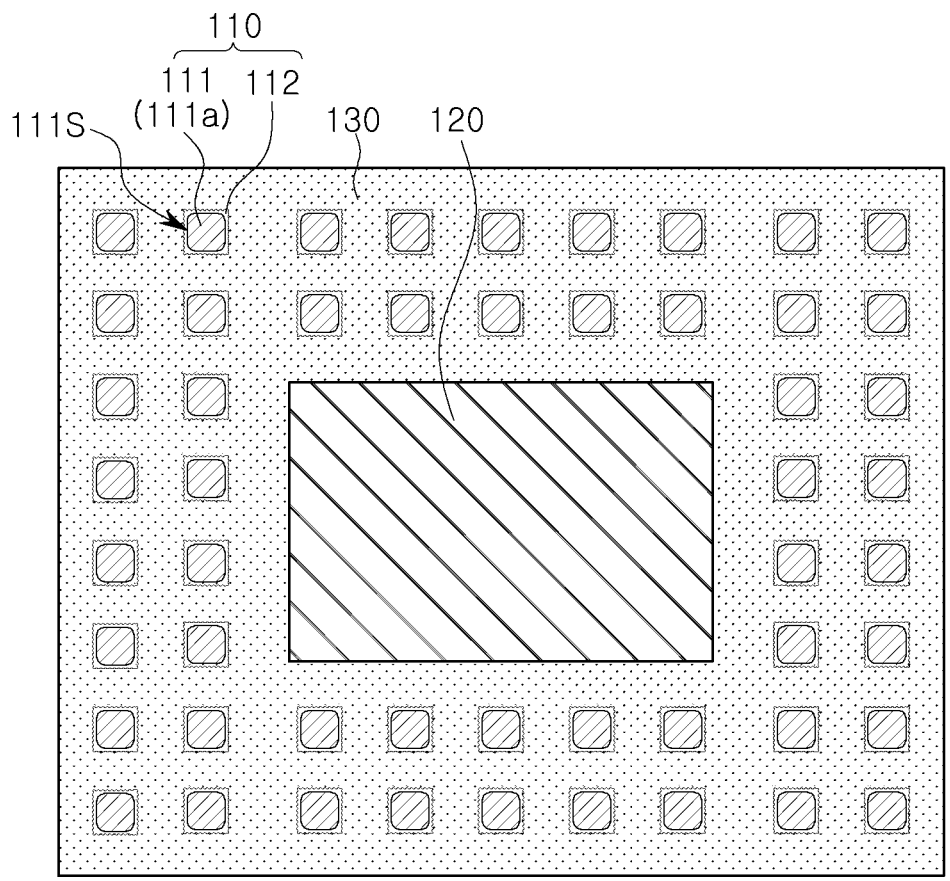
FIG. 2A is a plan view taken along line I-I' of FIG. 1.
Figure 2B:
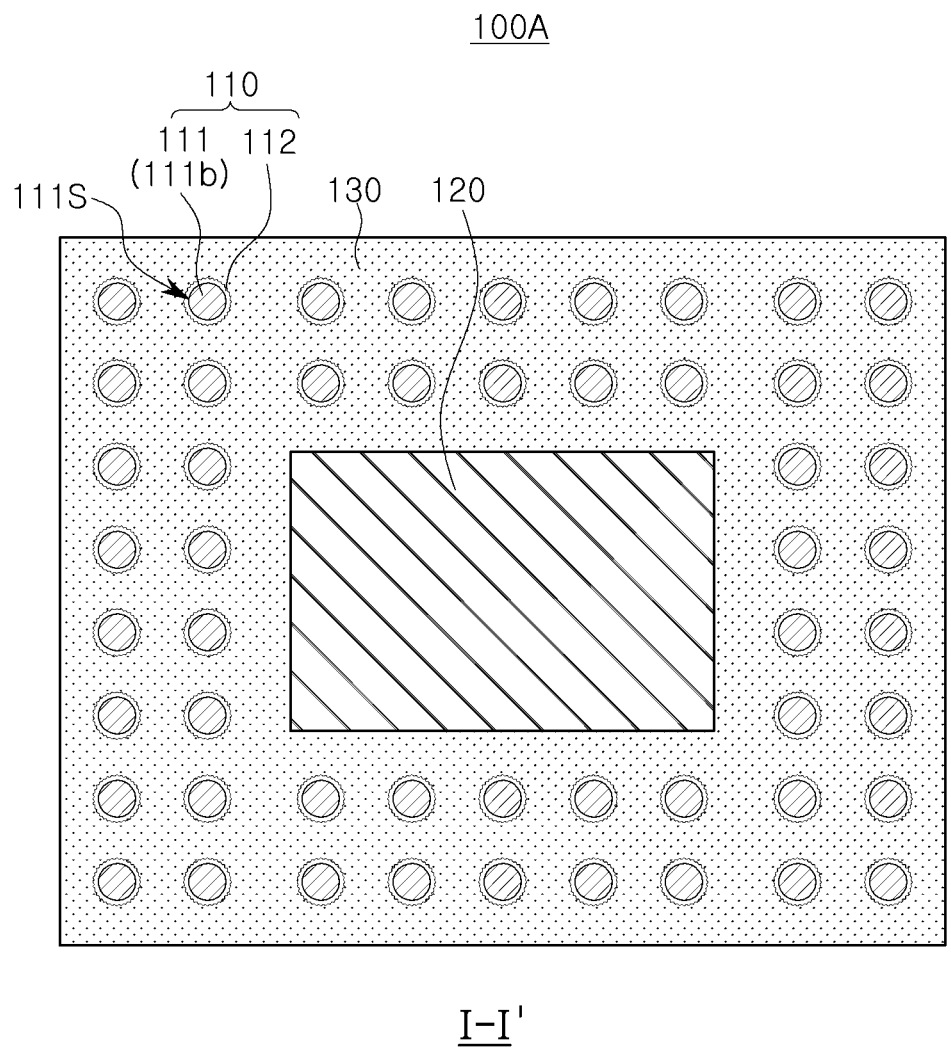
FIG. 2B is a plan view illustrating a modified example of some components of the semiconductor package of FIG. 2A.

FIG. 1 is a cross-sectional view illustrating a semiconductor package 100A according to an example embodiment of the present disclosure, FIG. 2A is a plan view taken along line I-I' of FIG. 1, and FIG. 2B is a plan view illustrating a modified example of some components of the semiconductor package 100A of FIG. 2A. In particular, FIG. 2B illustrates a modified example of a metal pillar 111a of FIG. 2A.

Referring to FIGS. 1 and 2A, the semiconductor package 100A may include a vertical connection structure 110, a semiconductor chip 120, an encapsulant 130, and a redistribution substrate 140. The semiconductor package 100A may further include a redistribution structure 150, a passivation layer 160, an underbump metal 170, and/or a connection bump 180.

The vertical connection structure 110 may be disposed on the redistribution substrate 140, and electrically connected to a first redistribution layer 142. The vertical connection structure 110 may provide an electrical path connecting between the first redistribution layer 142 and a second redistribution layer 152. The vertical connection structure 110 may be disposed around or adjacent a periphery of the semiconductor chip 120 on the redistribution substrate 140. A plurality of vertical connection structures 110 may be arranged to surround the semiconductor chip 120. The vertical connection structure 110 may have a surface roughness (Ra) of about 0.5 µm or more. As a result, interfacial delamination between the vertical connection structure 110 and the encapsulant 130 and between the vertical connection structure 110 and an insulating layer 141 of the redistribution substrate 140 may be reduced or prevented. In an example embodiment, the vertical connection structure 110 may include a metal pillar 111 and a first plating layer 112, and the surface roughness of the vertical connection structure 110 may be the surface roughness of the first plating layer 112 covering the surface of the metal pillar 111. As used herein, a metal pillar may refer to any vertically extending metal structure. The terms "first," "second," etc. may be used herein merely to distinguish one element or layer from another.

The metal pillar 111 may extend in a direction perpendicular to an upper surface of the redistribution substrate 140 and may have a tapered shape in which the width of a lower portion that is adjacent to the redistribution substrate 140 is wider than the width of an upper portion. The metal pillar 111 may have a bottom surface 111B facing the redistribution substrate 140, a top surface 111T positioned opposite to the bottom surface 111B, and a side surface 111S positioned between the bottom surface 111B and the top surface 111T. A horizontal or plan view cross-sectional shape of the metal pillar 111 in a direction parallel to the upper surface of the redistribution substrate 140 may be a circular shape or polygonal shape. For example, as illustrated in FIG. 2A, a metal pillar 111a may have a rectangular cross-sectional shape in plan view. The metal pillar 111a is formed by etching, and thus a corner portion of the cross-section shape may be curved. Referring to FIG. 2B, in a modified example, a metal pillar 111b may have a circular cross-sectional shape in plan view. As illustrated in FIGS. 2A and 2B, the plating layer 112 may be formed to continuously surround an edge or perimeter of the horizontal cross-sectional shape of the metal pillar 111a or 111b, or the side surface 111S of the metal pillar 111a or 111b. The metal pillar 111 may be formed of copper (Cu) or an alloy containing copper, but is not limited thereto. For example, the metal pillar 111 may also be formed of a metal material such as aluminum (Al), silver (Ag), tin (Sn), gold (Au), nickel (Ni), lead (Pb), titanium (Ti), or alloys thereof. The metal pillar 111 may be formed by etching a metal plate. In a case in which the surface of the metal pillar 111 is in direct contact with an insulating material such as the encapsulant 130, an interfacial delamination phenomenon may occur. As used herein, when elements or layers are described as being "directly" on or in "direct" contact with one another, no intervening elements or layers are present. In an example embodiment, the surface(s) of the plating layer 112 surrounding the surface(s) of the metal pillar 111 may be textured or roughened to suppress interfacial delamination between heterogeneous materials. As used herein, a textured or roughened surface may refer to structural characteristics that may be defined by a surface roughness.

The plating layer 112 may cover multiple surfaces or the entire surface of the metal pillar 111, and may have a textured or roughened surface with a surface roughness of about 0.5 µm or more. For example, the plating layer 112 may at least partially cover each of the bottom surface 111B, the top surface 111T, and the side surface 111S of the metal pillar 111. Therefore, the plating layer 112 may include a bottom plating layer or bottom 112B covering the bottom surface 111B of the metal pillar 111, a top plating layer or top 112T covering the top surface 111T of the metal pillar 111, and a side plating layer or side 112S covering the side surface 111S of the metal pillar 111. The roughened surface of the plating layer 112 may enhance adhesion between the plating layer 112 and the encapsulant 130 and between the plating layer 112 and the insulating layer 141 of the redistribution substrate 140. Therefore, parts of the side plating layer 112S and the top plate layer 112T having the roughened surfaces may be in direct contact with the encapsulant 130. Further, a part of the bottom plating layer 112B having the roughened surface may be in direct contact with the insulating layer 141 of the redistribution substrate 140. The plating layer 112 may be formed of, for example, a metal material such as copper (Cu), aluminum (Al), silver (Ag), tin (Sn), gold (Au), nickel (Ni), lead (Pb), titanium (Ti), or alloys thereof. The plating layer 112 may be formed of a metal material the same as or similar to that of the metal pillar 111, but is not limited thereto. The plating layer 112 may be formed on the surface of the metal pillar 111 by plating and may be formed to have a predetermined level or amount of surface roughness.

The semiconductor chip 120 may be disposed on the redistribution substrate 140, and may include a connection pad 120P electrically connected to the first redistribution layer 142. The semiconductor chip 120 may be a bare integrated circuit (IC) in which a separate bump or wiring layer is not formed, but is not limited thereto. The semiconductor chip 120 may also be a packaged integrated circuit. The semiconductor chip 120 may include a logic chip such as a central processing unit (CPU), a graphics processing unit (GPU), a field programmable gate array (FPGA), a digital signal processor (DSP), a cryptographic processor, a microprocessor, a microcontroller, an analog-digital converter, or an application-specific integrated circuit (ASIC), a volatile memory chip such as a dynamic random access memory (DRAM) or a static RAM (SRAM), or a non-volatile memory chip such as a phase-change RAM (PRAM), a magnetic RAM (MRAM), a resistive RAM (RRAM), or a flash memory. The connection pad 120P may be formed of, for example, aluminum (Al), but is not limited thereto. The connection pad 120P may be formed of another type of conductive material.

The encapsulant 130 may be disposed on the redistribution substrate 140, and cover the semiconductor chip 120 and the vertical connection structure 110. The encapsulant 130 may be formed of an insulating material. For example, the encapsulant 130 may be formed of a thermosetting resin such as an epoxy resin, a thermoplastic resin such as a polyimide resin, a resin having a reinforcement material such as an inorganic filler impregnated in the thermosetting resin and the thermoplastic resin, more specifically, Ajinomoto build up film (ABF), FR-4, bismaleimide triazine (BT), epoxy molding compound (EMC), or the like. A photosensitive resin such as a photoimageable dielectric (PID) resin may be used. A difference in thermal expansion coefficients between heterogeneous materials or the like may cause an interfacial delamination phenomenon between the encapsulant 130 and the vertical connection structure 110. In an example embodiment, a top surface and a side surface of the vertical connection structure 110 may be roughened to suppress the delamination phenomenon of the encapsulant 130.

The redistribution substrate 140 may include the first insulating layer 141, the first redistribution layer 142 disposed on the first insulating layer 141, and a first redistribution via 143 penetrating through the first insulating layer 141 and connected to the first redistribution layer 142. The redistribution substrate 140 may redistribute the connection pad 120P of the semiconductor chip 120. Multiple of each of the first insulating layer 141, the first redistribution layer 142, and the first redistribution via 143 may be present (for example, three). The redistribution substrate 140 may include fewer or more in number of the first insulating layers 141, first redistribution layers 142, and first redistribution vias 143 than those illustrated in the drawings.

The first insulating layer 141 may be disposed on a level between the first redistribution layer 141, and the semiconductor chip 120 and the vertical connection structure 110, and at least one first insulating layer 141 may be provided. The first insulating layer 141 may adhere to the bottom plating layer 112B of the vertical connection structure 110. The textured or roughened surface of the bottom plating layer 112B may enhance adhesion between the bottom plating layer 112B and the first insulating layer 141. The first insulating layer 141 may be formed of an insulating material. For example, the first insulating layer 141 may be formed of a photosensitive insulating material such as a photoimageable dielectric (PID) resin. A plurality of first insulating layers 141 may be disposed on different levels, respectively. Among the plurality of first insulating layers 141, the uppermost insulating layer 141 may adhere to the bottom plating layer 112B.

The first redistribution layer 142 may be formed of a metal material such as copper (Cu), aluminum (Al), silver (Ag), tin (Sn), gold (Au), nickel (Ni), lead (Pb), titanium (Ti), or alloys thereof. The first redistribution layer 142 may perform various functions depending on a design. For example, the first redistribution layer 142 may include a ground (GND) pattern, a power (PWR) pattern, and a signal (S) pattern. The signal (S) pattern may transfer various signals (such as data signals) other than those provided by for the ground (GND) pattern and the power (PWR) pattern.

The first redistribution via 143 may penetrate through the first insulating layer 141 to connect the first redistribution layer 142 to the vertical connection structure 110 or the connection pad 120P of the semiconductor chip 120, or connect the first redistribution layers 142 disposed on different levels, respectively, to each other. The first redistribution via 143 may be formed of a metal material such as copper (Cu), aluminum (Al), silver (Ag), tin (Sn), gold (Au), nickel (Ni), lead (Pb), titanium (Ti), or alloys thereof. The first redistribution via 143 may be a filled via completely filled with a metal material, or a conformal via in which a metal material is disposed along a side wall of a via hole. In a case of being formed in the same plating process, the first redistribution via 143 may be integrated with the first redistribution layer 142.

The redistribution structure 150 may include a second redistribution layer 152 disposed on the encapsulant 130, and a second redistribution via 153 electrically connecting the second redistribution layer 152 and the vertical connection structure 110 to each other. In an example embodiment, the second redistribution layer 152 may be disposed directly on the encapsulant 130, and connected to the vertical connection structure 110 through the second redistribution via 153 penetrating through a part of the encapsulant 130 covering an upper portion of the vertical connection structure 110. The second redistribution via 153 may be in direct contact with the upper plating layer 112T covering the top surface 111T of the metal pillar 111.

The second redistribution layer 152 may be at least partially exposed at an upper portion of the package 100A, and may be physically and electrically coupled with another electronic component provided outside the package 100A. The second redistribution layer 152 may be formed of a metal material such as copper (Cu), aluminum (Al), silver (Ag), tin (Sn), gold (Au), nickel (Ni), lead (Pb), titanium (Ti), or alloys thereof.

The second redistribution via 153 may electrically connect the second redistribution layer 152 to the vertical connection structure 110. The second redistribution via 153 may be formed of a metal material similar to that of the second redistribution layer 152. The second redistribution via 153 may be a filled via or a conformal via.

The passivation layer 160 may include a first passivation layer 160a disposed on the redistribution substrate 140 and a second passivation layer 160b disposed on the redistribution structure 150. The first passivation layer 160a may have an opening h1 partially exposing the first redistribution layer 142, and the second passivation layer 160b may have an opening h2 partially exposing the second redistribution layer 152. The first and second passivation layers 160a and 160b may be formed of an insulating material such as ABF, but is not limited thereto. The first and second passivation layers 160a and 160b may also be formed of another type of insulating material (for example, solder resist).

The underbump metal 170 may be disposed in the opening h1 of the first passivation layer 160a, and may be electrically connected to the first redistribution layer 142. The underbump metal 170 may improve connection reliability of the connection bump 180 and improve board level reliability of the package 100A. The underbump metal 170 may be formed of a metal material similar to that of the first redistribution layer 142.

The connection bump 180 may be disposed on a side of the redistribution substrate 140 that is opposite to a side on which the semiconductor chip 120 is disposed, and may be electrically connected to the first redistribution layer 142 exposed through the opening h1 of the first passivation layer 160a. The connection bump 180 may physically and/or electrically connect the semiconductor package 100A to an external device. The connection bump 180 may be formed of a low melting point metal, for example, tin (Sn) or an alloy (Sn—Ag—Cu) containing tin (Sn). The connection bump 180 may be a land, a ball, or a pin. At least some of a plurality of connection bumps 180 may be disposed in a fan-out region. The fan-out region refers to a region that does not overlap with the semiconductor chip 120 in a direction perpendicular to the upper surface or lower surface of the redistribution substrate 140.

FIGS. 3A through 3F are cross-sectional views schematically illustrating a method for manufacturing the semiconductor package 100A of FIG. 1.

Figure 3A:
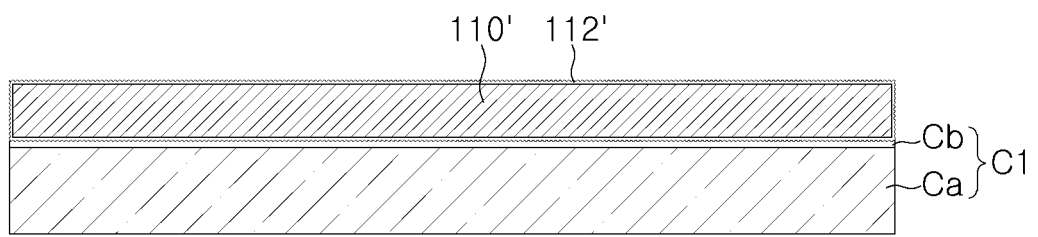
FIGS. 3A through 3F are cross-sectional views schematically illustrating a method for manufacturing the semiconductor package of FIG. 1.

Referring to FIG. 3A, a metal plate 110' on which a surface plating layer 112' is formed may be prepared and attached to a tape carrier C1. The surface plating layer 112' may be have a predetermined level or amount of surface roughness. For example, the surface plating layer 112' may have a surface roughness of about 0.5 μm or more. The metal plate 110' and the surface plating layer 112' may be formed of a metal material. For example, the metal plate 110' and the surface plating layer 112' may be formed of a metal material such as copper or an alloy containing copper. The tape carrier C1 may include a carrier body Ca and an adhesive layer Cb. The carrier body Ca and the adhesive layer Cb may be structures formed of an organic material, but the material of the carrier body Ca and the adhesive layer Cb is not limited thereto.

Figure 3B:
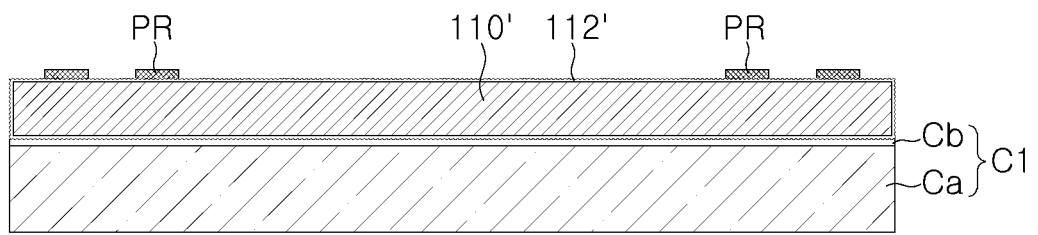

Referring to FIG. 3B, a patterned etching resist PR (for example, photoresist) may be formed on the surface plating layer 112'. The etching resist PR may be patterned so as to correspond to the vertical connection structure 110 to be described later.

Figure 3C:
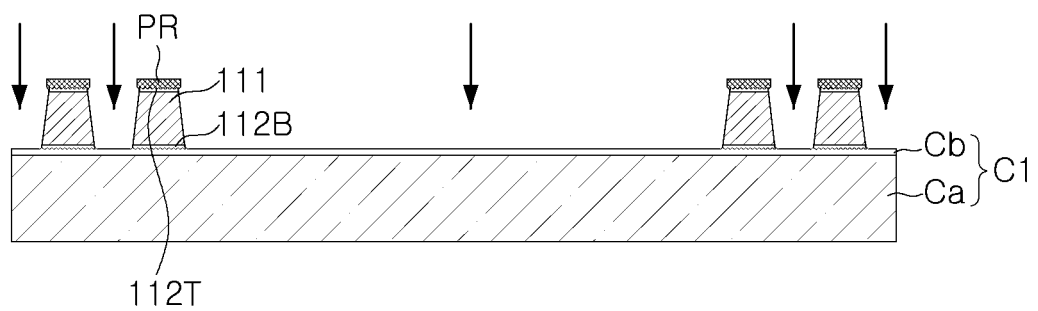

Referring to FIG. 3C, the metal pillar 111, the top plating layer 112T, and the bottom plating layer 112B may be formed by etching the surface plating layer 112' and the metal plate 111'. The metal pillar 111 formed by etching may have a tapered shape in which the width of a lower portion is wider than the width of an upper portion. The surface plating layer 112' and the metal plate 111' may be etched by using a copper chloride solution or alkali solution. However, the solution used for the etching is not limited thereto and may be variously selected depending on the type of metal material used to form the surface plating layer 112' and the metal plate 111'.

Figure 3D:
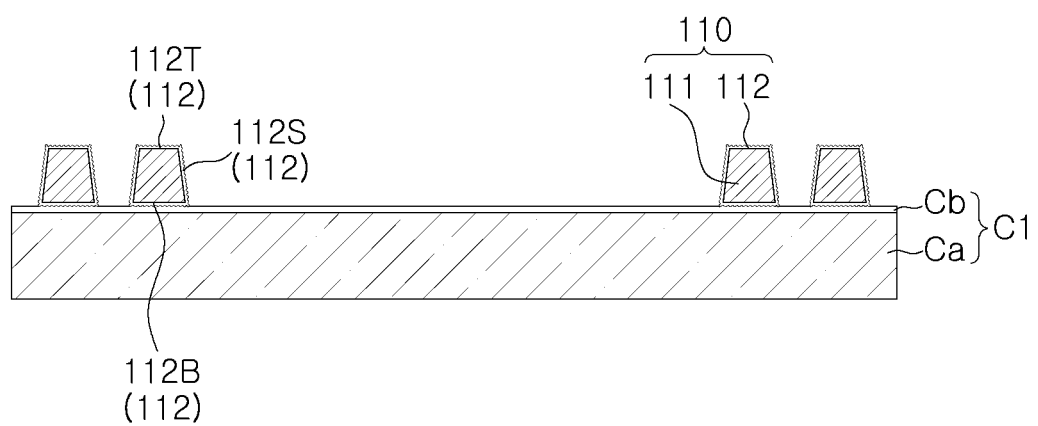

Referring to FIG. 3D, the side plating layer 112S may be formed on the exposed side surface of the metal pillar 111 in FIG. 3C. The side plating layer 112S may also have a surface roughness of about 0.5 μm or more. In a process of forming the side plating layer 112S, a plating layer separate from the surface plating layer 112' may be additionally formed on the top plating layer 112T. Hereinafter, however, plating layers formed on the top of the metal pillar 111 will be collectively referred to as the top plating layer 112T. Through the processes in FIGS. 3C and 3D, the vertical connection structure 110 including the metal pillar 111 that has the tapered shape and the plating layer 112 surrounding the bottom surface, the top surface, and the side surface of the metal pillar 111 may be formed. Therefore, the plating layer 112 with the textured or roughened surface may be in contact with the encapsulant 130 and the insulating layer 141 of the redistribution substrate 140 to be described later, and may enhance interfacial adhesion between heterogeneous materials.

Figure 3E:
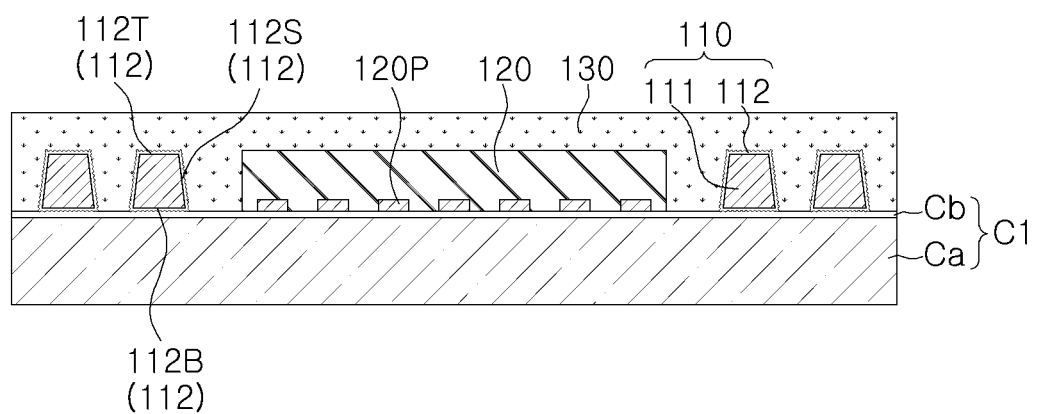

Referring to FIG. 3E, the semiconductor chip 120 may be attached to the adhesive layer Cb exposed by the etching in FIG. 3D, and the encapsulant 130 covering the semiconductor chip 120 and the vertical connection structure 110 may be formed. The semiconductor chip 120 may be disposed so that an active surface on which the connection pad 120P is disposed faces the adhesive layer Cb. The encapsulant 130 may be formed of, for example, ABF, but is not limited thereto.

Figure 3F:
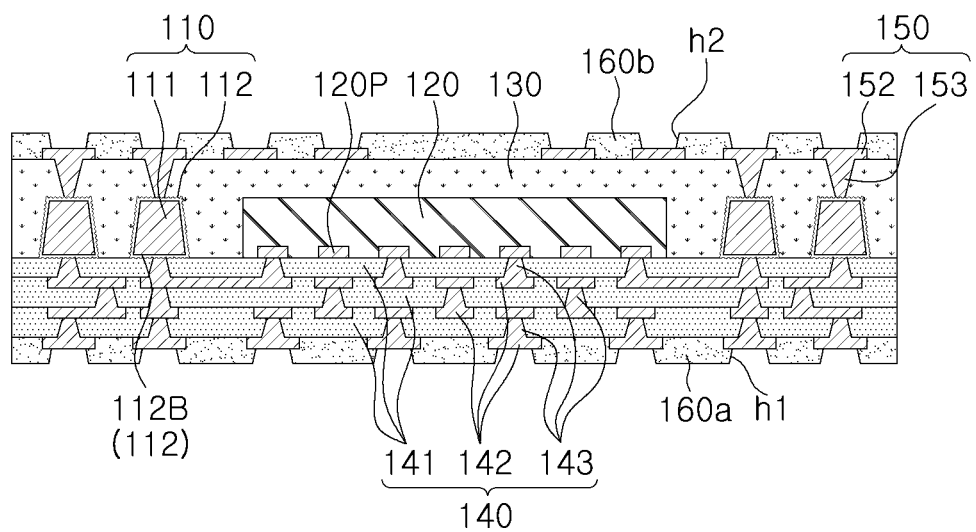

Referring to FIG. 3F, the redistribution substrate 140 may be formed on the connection pad 120P of the semiconductor chip 120 and the vertical connection structure 110 that are exposed by removing the tape carrier C1 of FIG. 3E, and the redistribution structure 150 may be formed so as to be positioned opposite to the redistribution substrate 140. The order in which the redistribution substrate 140 and the redistribution structure 150 are formed is not limited to a particular order. The redistribution substrate 140 may include the first insulating layer 141, the first redistribution layer 142, and the first redistribution via 143. The first insulating layer 141 may be formed of a PID resin. The first redistribution layer 142 and the first redistribution via 143 may be formed by etching and plating. A via hole in which the first redistribution via 143 is formed may be formed by photolithography. The redistribution structure 150 may include the second redistribution layer 152 and the second redistribution via 153, and the second redistribution layer 152 may be formed by etching and plating, similarly to the first redistribution layer 142. A via hole in which the second redistribution via 153 is formed may be formed by removing a part of the encapsulant 130 with a laser drill. The first and second passivation layers 160a and 160b may be formed on the first and second redistribution layers 142 and 152, respectively. The first passivation layer 160a may have the opening h1 partially exposing the first redistribution layer 142, and the second passivation layer 160b may have the opening h2 partially exposing the second redistribution layer 152.

Figure 4:
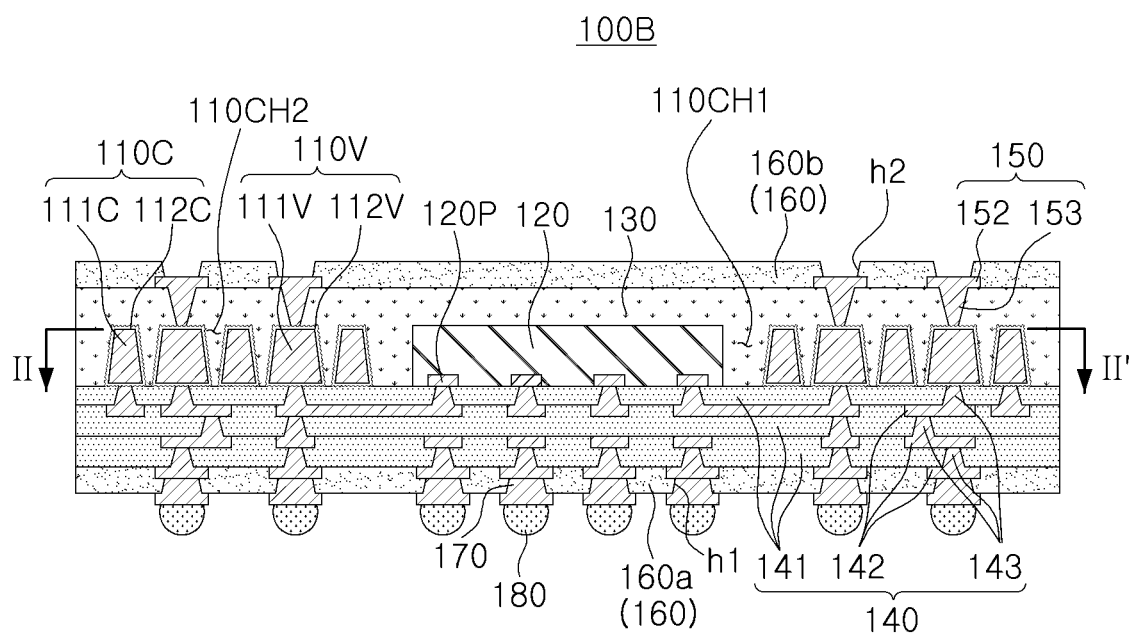
FIG. 4 is a cross-sectional view illustrating a semiconductor package according to an example embodiment of the present disclosure.
Figure 5:
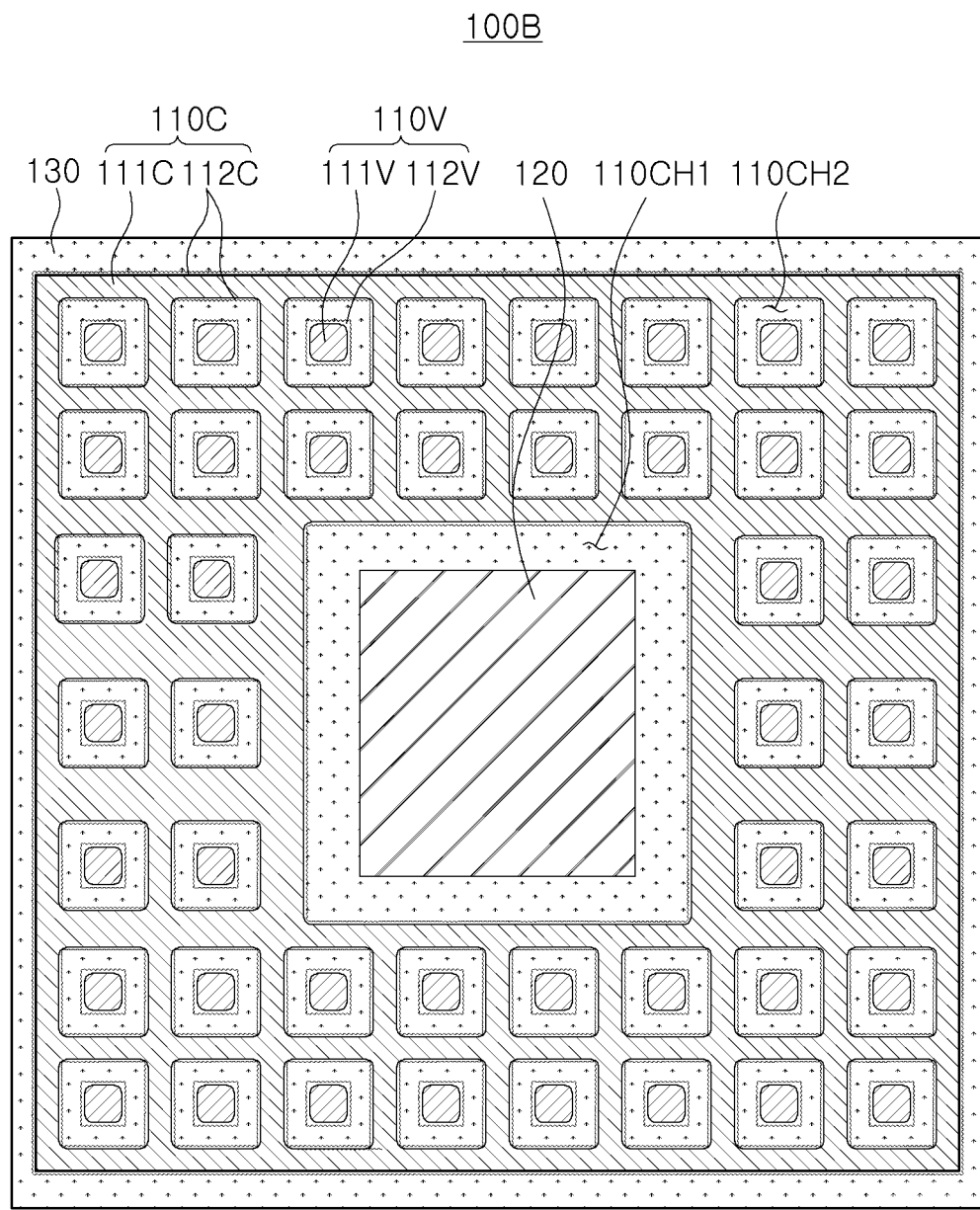
FIG. 5 is a plan view taken along line II-II' of FIG. 4.
Figure 6A:
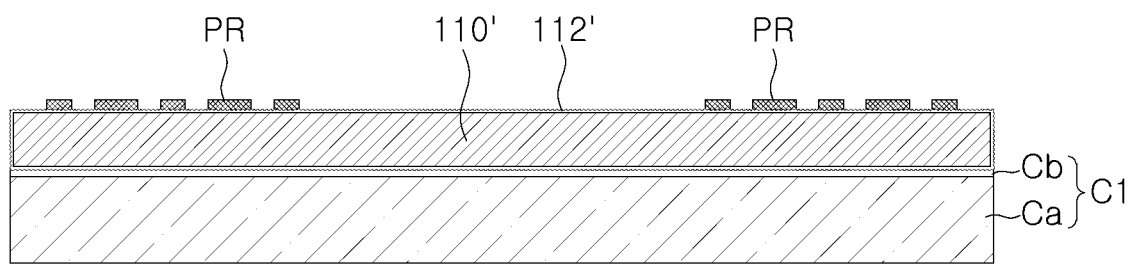
FIGS. 6A and 6B are cross-sectional views schematically illustrating a part of a method for manufacturing the semiconductor package of FIG. 4.
Figure 6B:
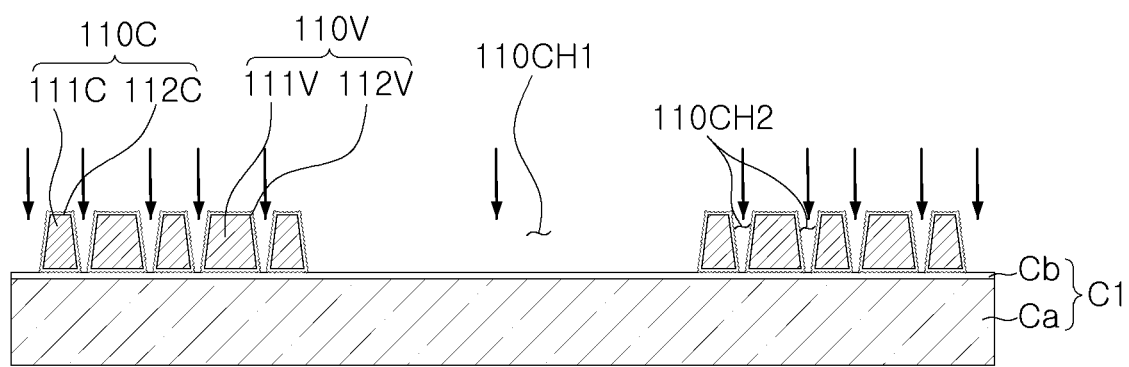

FIG. 4 is a cross-sectional view illustrating a semiconductor package 100B according to an example embodiment of the present disclosure, FIG. 5 is a plan view taken along line of FIG. 4; and FIGS. 6A and 6B are cross-sectional views schematically illustrating a part of a method for manufacturing the semiconductor package 100B of FIG. 4.

First, referring to FIGS. 4 and 5, the semiconductor package 100B may further include a core structure 110C having a first through-hole 110CH1 in which a semiconductor chip 120 is accommodated, and at least one second through-hole 110CH2 in which at least one vertical connection structure 110V is accommodated. The core structure 110C may be adjacent a periphery of or surround a side surface of each of the semiconductor chip 120 and the vertical connection structure 110V, and may improve the rigidity and/or heat dissipation characteristics of the package 100B.

The core structure 110C may include a metal frame 111C and a second plating layer 112C covering the surface of the metal frame 111C. The metal frame 111C may be formed to continuously or discontinuously surround the semiconductor chip 120 and the vertical connection structure 110V. The second plating layer 112C may be formed to cover a bottom surface, a top surface, and a side surface of the metal frame 111C. The second plating layer 112C may have a surface roughness of about 0.5 μm or more. In an example embodiment, since the second plating layer 112C is formed even on the top surface and the bottom surface of the metal frame 111C, the textured or roughened surface of the second plating layer 112C may be in direct contact with an insulating layer 141 of a redistribution substrate 140, in addition to an encapsulant 130, and may improve adhesion between the vertical connection structure 110V and an insulating material.

The core structure 110C is formed by etching the same metal plate as that for the vertical connection structure 110V (see FIGS. 6A and 6B), and thus may be formed of a metal material similar to that of the vertical connection structure 110V. For example, a metal pillar 111V and the metal frame 111C may be formed of the same first metal material, and a first plating layer 112V and the second plating layer 112C may be formed of the same second metal material. The first metal material and the second metal material may include copper (Cu) or an alloy containing copper, but are not limited thereto. For example, the first metal material and the second metal material may include a metal material such as aluminum (Al), silver (Ag), tin (Sn), gold (Au), nickel (Ni), lead (Pb), titanium (Ti), or alloys thereof. Further, the core structure 110C and the vertical connection structure 110V are simultaneously formed by the same etching process, and thus may have similar cross-sectional shapes. The core structure 110C and the vertical connection structure 110V may each have a tapered shape in which the width of a lower portion that is adjacent to the redistribution substrate 140 is wider than the width of an upper portion.

The core structure 110C may be electrically insulated from the vertical connection structure 110V. The core structure 110C may be used as a ground region for the semiconductor chip 120, or may be used as a dummy pattern. For example, a first redistribution layer 142 may include a ground pattern, a signal pattern, and a power pattern, and the core structure 110C may be electrically connected to the ground pattern of the first redistribution layer 142.

In an example embodiment, the semiconductor chip 120 may be disposed in the first through-hole 110CH1 of the core structure 110C, and at least one vertical connection structure 110V may be disposed in at least one second through-hole 110CH2. The encapsulant 130 may cover the semiconductor chip 120, the core structure 110C, and at least one vertical connection structure 110V, and may be used to substantially fill a space between the first through-hole 110CH1 and the semiconductor chip 120, and a space between at least one second through-hole 110CH2 and at least one vertical connection structure 110V. The first and second plating layers 112V and 112C with roughened surfaces may be in direct contact with portions of the encapsulant 130 substantially filling the spaces described above.

Hereinafter, a process of forming the core structure 110C and the vertical connection structure 110V will be described with reference to FIGS. 6A and 6B.

Referring to FIG. 6A, a metal plate 110' on which a surface plating layer 112' is formed may be prepared, similarly to FIG. 3A, and a patterned etching resist PR may be formed on the surface plating layer 112'. In contrast with FIG. 3B, the etching resist PR is patterned to correspond not only to the vertical connection structure 110V, but also to the core structure 110C.

Referring to FIG. 6B, the metal plate 110' may be etched to form the metal pillar 111V and the metal frame 111C each having the top surface and bottom surface on which a plating layer is formed, similarly to FIGS. 3C and 3D. Then, a plating layer covering the side surface of each of the metal pillar 111V and the metal frame 111C may be additionally formed to form the vertical connection structure 110V including the metal pillar 111V that has the tapered shape, and the first plating layer 112V covering the bottom surface, the top surface, and the side surface of the metal pillar 111V, and the core structure 110C including the metal frame 111C that has the tapered shape, and the second plating layer 112c covering the bottom surface, the top surface, and the side surface of the metal frame 111C. Therefore, the first and second plating layers 112V and 112C with the roughened surfaces may be in direct contact with the encapsulant 130 and the insulating layer 141 of the redistribution substrate 140, and may enhance interfacial adhesion between heterogeneous materials.

Figure 7A:
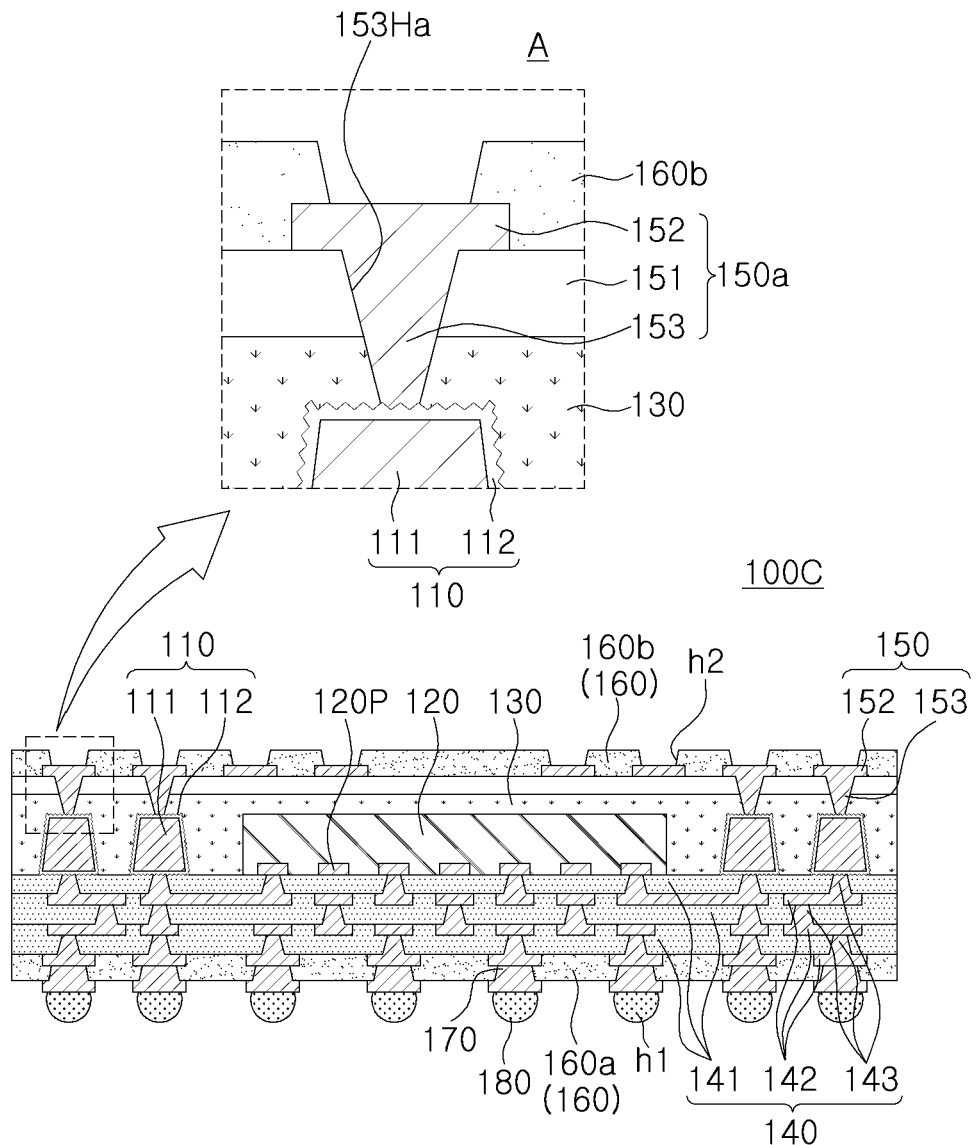
FIG. 7A is a cross-sectional view illustrating a semiconductor package according to an example embodiment of the present disclosure.
Figure 7B:
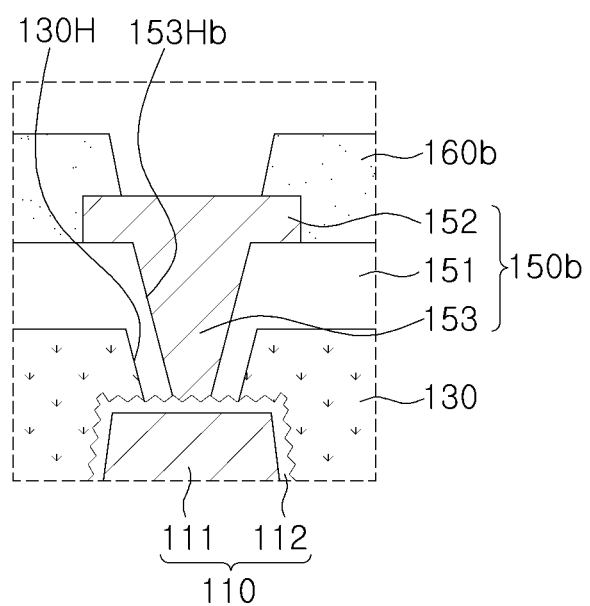
FIG. 7B is a partially enlarged view illustrating a modified example of some components of the semiconductor package of FIG. 7A.

FIG. 7A is a cross-sectional view illustrating a semiconductor package 100C according to an example embodiment of the present disclosure, and FIG. 7B is a partially enlarged view illustrating a modified example of some components of the semiconductor package 100C of FIG. 7A. More particularly, FIG. 7B is a partially enlarged view corresponding to a region "A" of FIG. 7A, and illustrates a modified example of a redistribution structure 150a of FIG. 7A.

Referring to FIG. 7A, the semiconductor package 100C may include the redistribution structure 150a including a second insulating layer 151 disposed between a second redistribution layer 152 and an encapsulant 130. For example, the redistribution structure 150a may include the second insulating layer 151 disposed between the second redistribution layer 152 and the encapsulant 130, and a second redistribution via 153 penetrating through the second insulating layer 151 and the encapsulant 130 to connect the second redistribution layer 152 and a vertical connection structure 110 to each other. In an example embodiment, a via hole 153Ha in which the second redistribution via 153 is formed may penetrate through both the encapsulant 130 and the second insulating layer 151, and a side surface of the second redistribution via 153 may be in contact with each of the encapsulant 130 and the second insulating layer 151. The encapsulant 130 and the second insulating layer 151 may be formed of the same insulating material in some embodiments. For example, the encapsulant 130 and the second insulating layer 151 may be formed of ABF, and the via hole 153Ha may be formed by using a laser drill.

Referring to FIG. 7B, in the modified example, a redistribution structure 150b may include a second insulating layer 151 substantially filling the first via hole 130H that at least partially exposes the top surface of the vertical connection structure 110, and a second redistribution via 153 penetrating through the second insulating layer 151 in the first via hole 130H to connect a second redistribution layer 152 and the vertical connection structure 110 to each other. For example, an inner wall of the first via hole 130H of the encapsulant 130 that partially exposes the vertical connection structure 110 and a side surface of the second redistribution via 153 may be isolated from each other by the second insulating layer 151 substantially filling the first via hole 130H. The encapsulant 130 and the second insulating layer 151 may each be formed of a different insulating material in some embodiments. For example, the encapsulant 130 may be formed of ABF, and the second insulating layer 151 may be formed of a PID resin. Therefore, the first via hole 130H and a second via hole 153Hb may be formed by different methods. For example, the first via hole 130H may be formed by using a laser drill, and the second via hole 153Hb may be formed by photolithography.

Figure 8:
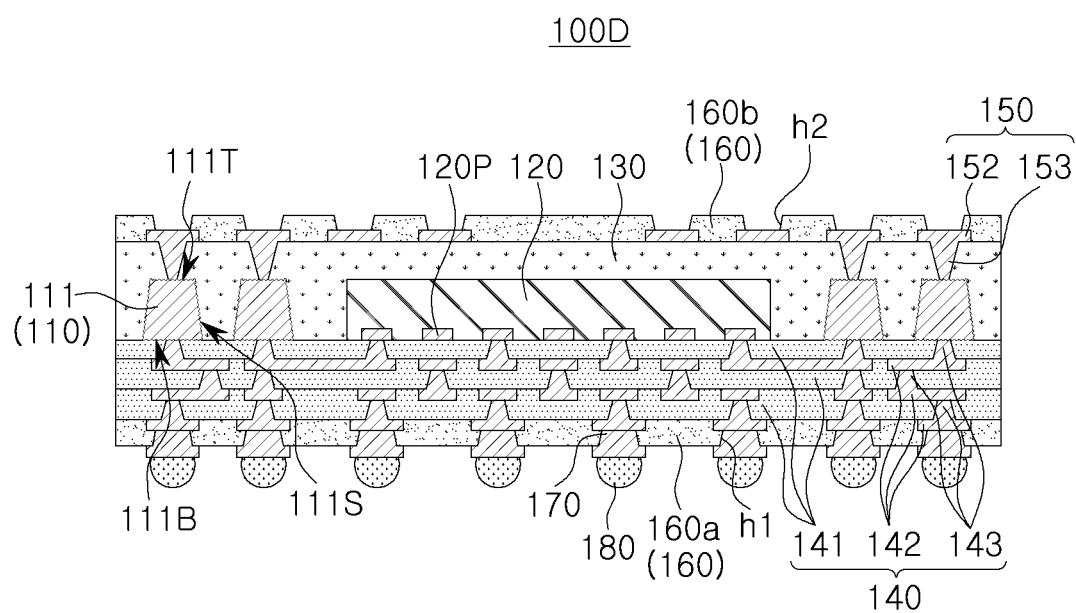
FIG. 8 is a cross-sectional view illustrating a semiconductor package according to an example embodiment of the present disclosure.

FIG. 8 is a cross-sectional view illustrating a semiconductor package 100D according to an example embodiment of the present disclosure.

Referring to FIG. 8, the semiconductor package 100D may include a vertical connection structure 110 in which the surface of the metal pillar 111 itself are roughened. For example, the vertical connection structure 110 or the metal pillar 111 may have a bottom surface 111B facing a redistribution substrate 140, a top surface 111T positioned opposite to the bottom surface 111B, and a side surface 111S positioned between the bottom surface 111B and the top surface 111T, and each of the bottom surface 111B, the top surface 111T, and the side surface 111S of the vertical connection structure 110 or the metal pillar 111 may have a surface roughness of about 0.5 μm or more. In an example embodiment, the roughened surface may be provided by directly etching the surface of the metal pillar 111.

Figure 9:
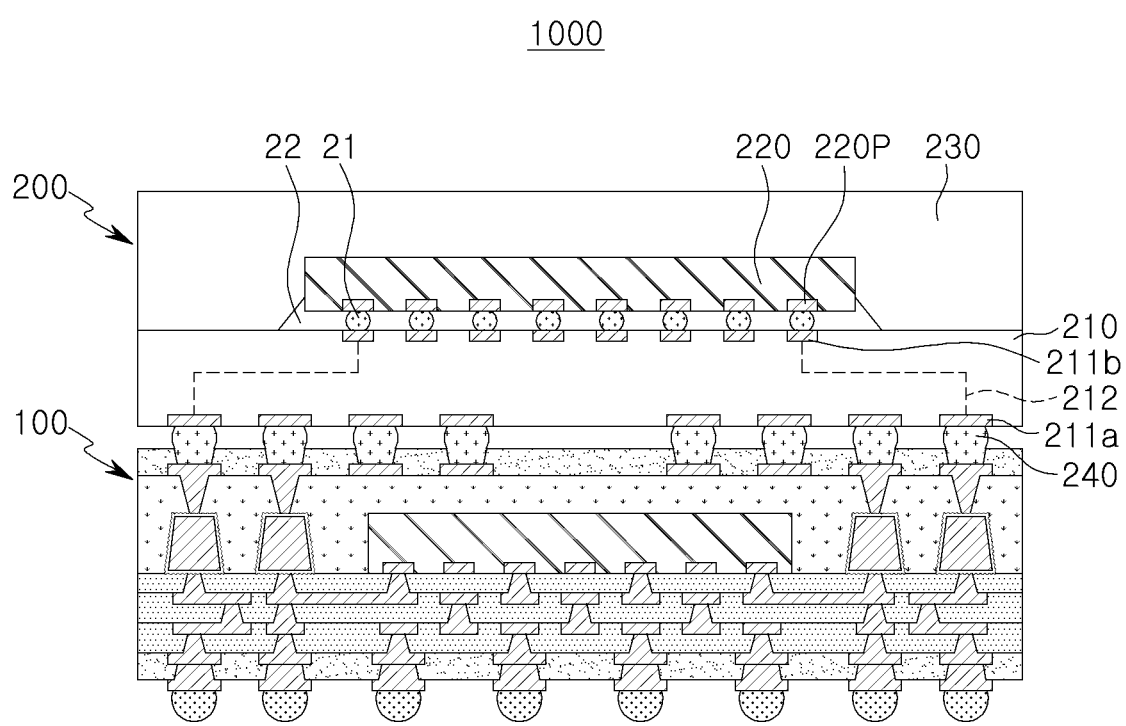
FIG. 9 is a cross-sectional view illustrating a semiconductor package according to an example embodiment of the present disclosure.

FIG. 9 is a cross-sectional view illustrating a semiconductor package 1000 according to an example embodiment of the present disclosure.

Referring to FIG. 9, the semiconductor package 1000 may have a package-on-package structure in which a first semiconductor package 100 and a second semiconductor package 200 are coupled to each other. The first semiconductor package 100 may include any of the semiconductor packages 100A to 100D illustrated in FIG. 1 and the like. The second semiconductor package 200 may include a second redistribution substrate 210, a second semiconductor chip 220, and a second encapsulant 230.

The second redistribution substrate 210 may include redistribution pads 211*a* and 211*b* that are formed at a lower surface and an upper surface of the second redistribution substrate 210, respectively, and are electrically externally connectable, and the second redistribution substrate 210 may include a redistribution circuit 212 formed therein and connected to the redistribution pads 211*a* and 211*b*. The redistribution circuit 212 may redistribute a connection pad 220P of the second semiconductor chip 220 to a fan-out region.

The second semiconductor chip 220 may include the connection pad 220P connected to an internal integrated circuit, and the connection pad 220P may be electrically connected to the second redistribution substrate 210 through a metal bump 21. The metal bump 21 may be surrounded by an underfill material 22. The underfill material 22 may be an insulating material such as an epoxy resin. The metal bump 21 may include a solder ball or copper pillar. In a modified example, the connection pad 220P of the second semiconductor chip 220 may be in direct contact with the upper surface of the second redistribution substrate 210, and may be electrically connected to the redistribution circuit 212 through a via in the second redistribution substrate 210. Further, in a modified example, the second semiconductor chip 220 may be mounted on the second redistribution substrate 210 by wire bonding.

The second encapsulant 230 may be formed of a material the same as or similar to that of the first encapsulant 130 of the first semiconductor package 100. The second semiconductor package 200 may be physically and electrically connected to the first semiconductor package 100 through a connection bump 240. The connection bump 240 may be electrically connected to the redistribution circuit 212 in the second redistribution substrate 210 through the redistribution pad 211*a* formed at the lower surface of the second redistribution substrate 210. The connection bump 240 may be formed of a low melting point metal, for example, tin (Sn) or an alloy containing tin (Sn).

As set forth above, according to the example embodiments of the present disclosure, the semiconductor package in which multiple surfaces of the metal pillar or a plating layer thereon is roughened to improve adhesion between the metal pillar and the surrounding insulating material may be provided.

Further, the semiconductor package, in which the core structure formed by processing one metal plate and the vertical connection structure are introduced to realize excellent rigidity and improve heat dissipation characteristics, may be provided.

While example embodiments have been shown and described above, it will be apparent to those skilled in the art that modifications and variations could be made without departing from the scope of the present invention as defined by the appended claims.

What is claimed is:

1. A semiconductor package comprising:
a redistribution substrate comprising a first redistribution layer;
a semiconductor chip on the redistribution substrate and electrically connected to the first redistribution layer;
a vertical connection structure adjacent a periphery of the semiconductor chip on the redistribution substrate and electrically connected to the first redistribution layer;
an encapsulant on the redistribution substrate, the semiconductor chip, and the vertical connection structure;
a redistribution structure on the encapsulant and comprising a second redistribution layer electrically connected to the vertical connection structure; and
a connection bump on the redistribution substrate opposite to the semiconductor chip and electrically connected to the first redistribution layer,
wherein the vertical connection structure comprises:
a metal pillar having a bottom surface facing the redistribution substrate, a top surface opposite to the bottom surface, and a side surface between the bottom surface and the top surface; and
a plating layer having a roughened surface on each of the bottom surface, the top surface, and the side surface of the metal pillar, wherein the bottom surface is in electrical contact with the first redistribution layer.

2. The semiconductor package of claim 1, wherein the roughened surface of the plating layer has a surface roughness of about 0.5 µm or more.

3. The semiconductor package of claim 1, wherein the roughened surface of the plating layer is in direct contact with the encapsulant.

4. The semiconductor package of claim 1, wherein the redistribution substrate further comprises at least one first insulating layer between the first redistribution layer and the semiconductor chip and between the first redistribution layer and the vertical connection structure, and wherein a bottom of the plating layer comprising the roughened surface directly contacts the at least one first insulating layer of the redistribution substrate, the bottom of the plating layer extending between the bottom surface of the metal pillar and the at least one first insulating layer.

5. The semiconductor package of claim 1, wherein the metal pillar has a circular or polygonal cross-sectional shape in a direction parallel to an upper surface of the redistribution substrate, and the plating layer continuously extends along a perimeter of the cross-sectional shape of the metal pillar.

6. The semiconductor package of claim 1, wherein the metal pillar has a tapered shape in which a lower portion thereof that is adjacent to the redistribution substrate is wider than an upper portion thereof.

7. The semiconductor package of claim 1, wherein the redistribution structure further comprises a redistribution via extending through a part of the encapsulant covering an upper portion of the vertical connection structure to electrically connect the second redistribution layer to the vertical connection structure, and wherein a top of the plating layer is in contact with the redistribution via, the top of the plating layer extending on the top surface of the metal pillar.

8. The semiconductor package of claim 7, wherein the redistribution structure further comprises a second insulating layer between the second redistribution layer and the encapsulant, and the redistribution via extends through the second insulating layer and the encapsulant to electrically connect the second redistribution layer to the vertical connection structure.

9. The semiconductor package of claim 1, wherein the encapsulant comprises an opening on a top surface of the vertical connection structure, and the redistribution structure further comprises a second insulating layer between the second redistribution layer and the encapsulant and extending into the opening of the encapsulant, and a redistribution via extending through the second insulating layer in the opening to electrically connect the second redistribution layer to the vertical connection structure.

10. A semiconductor package comprising:

a redistribution substrate comprising a first redistribution layer;

a core structure on the redistribution substrate and comprising a first through-hole and at least one second through-hole adjacent a periphery of the first through-hole;

a semiconductor chip in the first through-hole of the core structure and electrically connected to the first redistribution layer;

at least one vertical connection structure in the at least one second through-hole of the core structure and electrically connected to the first redistribution layer;

an encapsulant on the redistribution substrate, the semiconductor chip, the core structure, and the at least one vertical connection structure; and a redistribution structure on the encapsulant and comprising a second redistribution layer electrically connected to the at least one vertical connection structure, wherein the at least one vertical connection structure comprises a metal pillar extending in a vertical direction and a first plating layer on a surface of the metal pillar, the core structure comprises a metal frame adjacent a periphery of the semiconductor chip and the at least one vertical connection structure, and a second plating layer on a surface of the metal frame, wherein the first and second through-holes extend through the metal frame such that the metal frame extends around a periphery of the semiconductor chip, and each of the first and second plating layers comprises a respective roughened surface.

11. The semiconductor package of claim 10, wherein the surface of the metal pillar having the first plating layer with the roughened surface thereon comprises a top surface and a bottom surface of the metal pillar, and the surface of the metal frame having the second plating layer with the roughened surface thereon comprises a top surface and a bottom surface of the metal frame.

12. The semiconductor package of claim 10, wherein the respective roughened surface of each of the first and second plating layers has a surface roughness of about 0.5 µm or more.

13. The semiconductor package of claim 10, wherein the metal pillar and the metal frame comprise a same first metal material, and the first and second plating layers comprise a same second metal material.

14. The semiconductor package of claim 10, wherein each of the core structure and the at least one vertical connection structure has a tapered shape in which a lower portion thereof that is adjacent to the redistribution substrate is wider than an upper portion thereof.

15. The semiconductor package of claim 10, wherein respective portions of the encapsulant substantially fill a first space between the first through-hole and the semiconductor chip, and a second space between the at least one second through-hole and the at least one vertical connection structure, and wherein the first and second plating layers are in direct contact with the respective portions of the encapsulant.

16. The semiconductor package of claim 10, wherein the core structure is electrically insulated from the vertical connection structure.

17. The semiconductor package of claim 10, wherein the first redistribution layer comprises a ground pattern, a signal pattern, and a power pattern, and wherein the core structure is electrically connected to the ground pattern of the first redistribution layer.

18. A semiconductor package comprising:

a redistribution substrate comprising a redistribution layer;

a semiconductor chip on the redistribution substrate and electrically connected to the redistribution layer;

a vertical connection structure on the redistribution substrate, electrically connected to the redistribution layer at a bottom surface thereof, and having a surface roughness (Ra) of about 0.5 µm or more, wherein the vertical connection structure comprises the bottom surface facing the redistribution substrate, a top surface opposite to the bottom surface, and a side surface between the bottom surface and the top surface, and each of the bottom surface, the top surface, and the side surface comprises the surface roughness; and an encapsulant on the redistribution substrate, the semiconductor chip, and the vertical connection structure.

19. The semiconductor package of claim 18, wherein the vertical connection structure comprises a metal pillar extending from an upper surface of the redistribution substrate in a vertical direction, and a plating layer covering a surface of the metal pillar, wherein the plating layer defines the bottom surface, the top surface, and the side surface of the vertical connection structure.

20. The semiconductor package of claim 1, wherein the plating layer is a first plating layer, and further comprising:

a core structure on the redistribution substrate, the core structure comprising a metal frame including a first through-hole and a second through-hole extending therethrough, wherein the semiconductor chip is in the first through-hole with the metal frame extending around a periphery of the semiconductor chip and the vertical connection structure is in the second through-hole; and a second plating layer on a surface of the metal frame, wherein the second plating layer comprises a roughened surface.

* * * * *